(12) United States Patent
Kim et al.

(10) Patent No.: US 10,168,627 B2
(45) Date of Patent: Jan. 1, 2019

(54) EXPOSURE APPARATUS AND METHOD FOR CLEANING THE SAME

(71) Applicant: Samsung Electronics Co., Ltd., Suwon-si (KR)

(72) Inventors: Sungjoo Kim, Seoul (KR); Yun kyeong Jang, Hwaseong-si (KR); Jinhong Park, Incheon (KR); Dohyun Seo, Suwon-si (KR); HyunHoon Lee, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 11 days.

(21) Appl. No.: 15/135,561

(22) Filed: Apr. 22, 2016

(65) Prior Publication Data

US 2016/0357117 A1 Dec. 8, 2016

(30) Foreign Application Priority Data

Jun. 3, 2015 (KR) ........................ 10-2015-0078660

(51) Int. Cl.
*G03F 7/20* (2006.01)

(52) U.S. Cl.
CPC ................ *G03F 7/70925* (2013.01)

(58) Field of Classification Search
CPC ................ G03F 7/70925; G03F 7/70933
USPC ....................................... 430/325
See application file for complete search history.

(56) References Cited

U.S. PATENT DOCUMENTS

| 5,145,649 | A | * | 9/1992 | Iizuka | B08B 7/0035 134/1 |
|---|---|---|---|---|---|
| 6,828,569 | B2 | | 12/2004 | Van Schaik et al. | |
| 6,856,376 | B2 | | 2/2005 | Heerens et al. | |
| 8,382,301 | B2 | | 2/2013 | Ehm et al. | |
| 8,419,862 | B2 | | 4/2013 | Ehm et al. | |
| 2008/0088810 | A1 | | 4/2008 | Huh et al. | |
| 2011/0058147 | A1 | | 3/2011 | Ehm et al. | |
| 2011/0262866 | A1 | * | 10/2011 | Nakayama | G03F 7/70925 430/311 |
| 2013/0319466 | A1 | | 12/2013 | Mizoguchi et al. | |
| 2014/0042715 | A1 | | 2/2014 | Hsu et al. | |

FOREIGN PATENT DOCUMENTS

| JP | 2004-186614 A | 7/2004 |
|---|---|---|
| JP | 2009-026935 A | 2/2009 |
| JP | 2012-243852 A | 12/2012 |

* cited by examiner

*Primary Examiner* — Daborah Chacko-Davis
(74) *Attorney, Agent, or Firm* — Muir Patent Law, PLLC

(57) ABSTRACT

An exposure apparatus and manufacturing methods using the exposure apparatus are disclosed. An exposure apparatus includes a light source system generating light, an optical system controlling and patterning the light, a substrate system on which an exposure process is performed on a substrate by the patterned light, and a control unit controlling the light source system, the optical system and the substrate system. The optical system includes a chamber, a reflection member disposed in the chamber to control the light, and a first on-off valve installed on one side of the chamber opposite to the substrate system. The control unit controls the optical system such that the first on-off valve is opened during the exposure process and is closed during a cleaning process performed to the inside of the chamber.

4 Claims, 6 Drawing Sheets

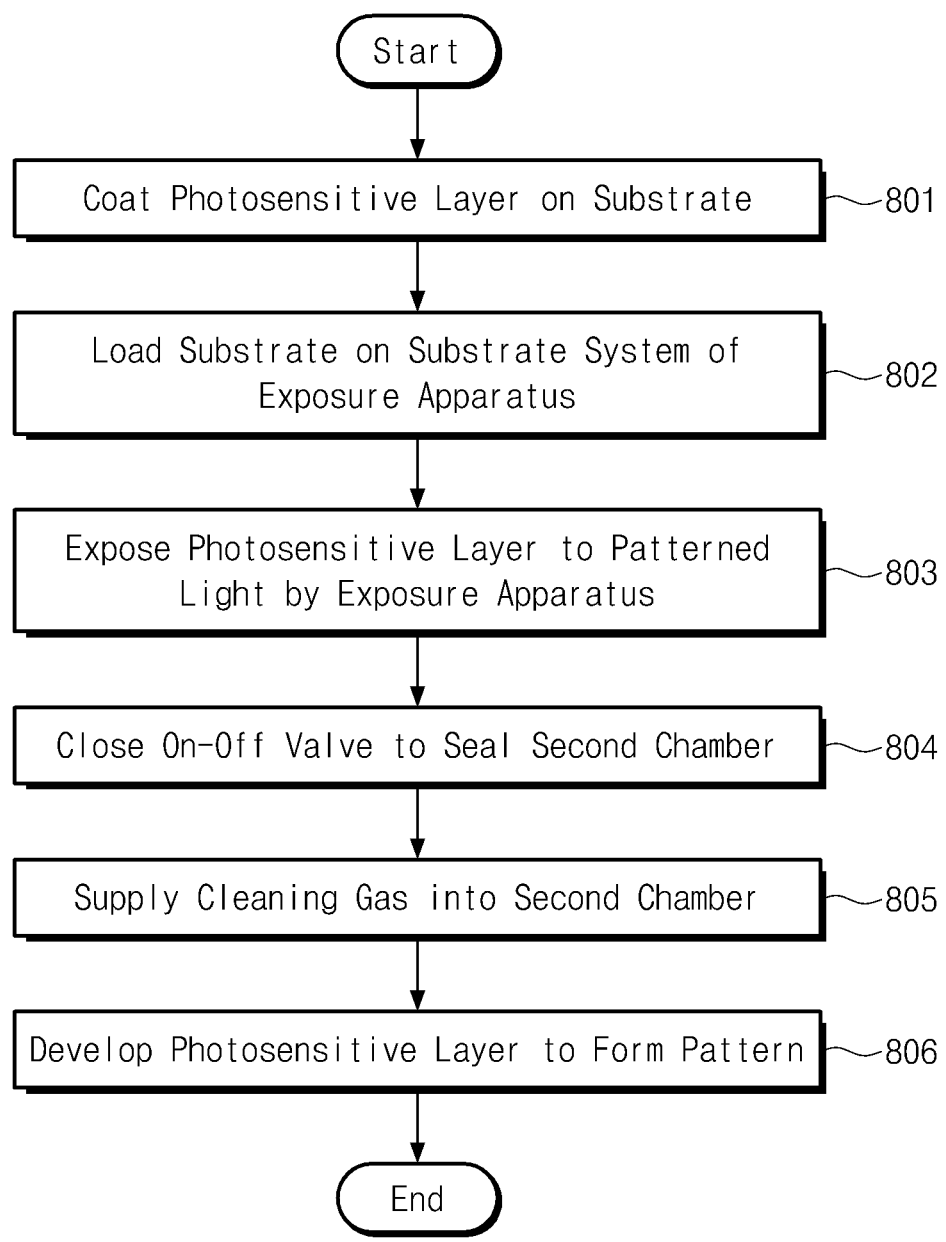

EXPOSURE APPARATUS AND METHOD FOR CLEANING THE SAME

CROSS-REFERENCE TO RELATED APPLICATION

This U.S. non-provisional patent application claims priority under 35 U.S.C. § 119 to Korean Patent Application No. 10-2015-0078660, filed on Jun. 3, 2015, in the Korean Intellectual Property Office, the disclosure of which is hereby incorporated by reference in its entirety.

BACKGROUND

The present disclosure relates to an apparatus for a photolithography process and, more particularly, to an exposure apparatus and a method for cleaning the inside of the exposure apparatus.

A photolithography process may include a photoresist-coating process for forming a photoresist layer on a semiconductor substrate, a soft bake process for hardening the photoresist layer by volatilizing a solvent of the photoresist layer, an exposure process for transferring a specific pattern to the hardened photoresist layer, a development process for developing the photoresist layer to which the pattern is transferred, and a post-bake process for hardening a photoresist pattern formed by the development process.

An exposure apparatus may image a pattern on a substrate. Generally, the exposure apparatus may irradiate light to a photo mask to transfer the pattern formed on the photo mask to the substrate. As sizes of patterns to be imaged on a substrate have been reduced, a wavelength of light for photolithography has also been reduced. Thus, the exposure process is currently performed using extreme ultraviolet (EUV). However, the exposure apparatus using light having a short wavelength may be sensitive to contamination particles, so it is important to clean the inside of a chamber of the exposure apparatus.

SUMMARY

Embodiments of the inventive concepts may provide an exposure apparatus capable of selectively adjusting a cleaning start time and a cleaning performance time of the inside of a chamber, and a method for cleaning the inside of the chamber.

Embodiments of the inventive concepts may also provide an exposure apparatus with improved ability to clean the inside of the exposure apparatus and a method for cleaning the inside of the exposure apparatus.

In certain embodiments, an exposure apparatus may include a light source system generating light, an optical system controlling and patterning the light, a substrate system on which an exposure process is performed on a substrate by the patterned light, and a control unit controlling the light source system, the optical system and the substrate system. The optical system may include a chamber, a reflection member disposed in the chamber to control the light, and a first on-off valve installed on one side of the chamber opposite to the substrate system. The control unit may control the optical system such that the first on-off valve is opened during the exposure process and is closed during a cleaning process performed to the inside of the chamber.

In certain embodiments, the optical system may further include a gas supply member configured to inject a cleaning gas into the chamber. The control unit may control the optical system such that the cleaning gas is supplied into the chamber through the gas supply member during the cleaning process.

In certain embodiments, the optical system may further include an exhaust line extending from one side of the chamber, the exhaust line sucking particles located in the chamber to exhaust the particles, and a second on-off valve installed on the exhaust line.

In certain embodiments, the control unit may control the optical system such that the second on-off valve is closed during the exposure process and is opened during the cleaning process.

In certain embodiments, the substrate system may include a support member supporting the substrate. The exhaust line may extend toward the substrate supported by the support member, and an end of the exhaust line may be located over the substrate supported by the support member.

In certain embodiments, the first on-off valve and the exhaust line may be adjacent to each other.

In certain embodiments, the substrate system may further include an image-sensing member photographing the particles exhausted from the exhaust line.

In certain embodiments, the image-sensing member may photograph the particles exhausted through the exhaust line when the cleaning process is performed, and the control unit may analyze image data obtained by the image-sensing member.

In certain embodiments, the control unit may control the substrate system and the optical system to change at least one of a kind of the cleaning gas, a flow rate of the cleaning gas or a cleaning performance time, based on analysis results of the particles.

In certain embodiments, the optical system may further include an adsorption member disposed adjacently to the first on-off valve to adsorb the particles occurring during the exposure process.

In certain embodiments, the adsorption member may be coupled to an outer surface of one side of the chamber and may be detachable from the chamber.

In certain embodiments, the chamber may be a vacuum chamber.

In certain embodiments, the light may be extreme ultraviolet.

In certain embodiments, a method for cleaning an exposure apparatus may include generating light from a light source system, controlling and patterning the generated light by a reflection member of a chamber of an optical system, transmitting the patterned light to a substrate system to perform an exposure process on a substrate, closing a first on-off valve disposed between the chamber and the substrate system to seal the chamber during or after the exposure process, and during or after the exposure process, supplying a cleaning gas into the chamber to perform a cleaning process to the inside of the chamber.

In certain embodiments, particles in the chamber may be exhausted to the substrate through an exhaust line extending from the chamber when the cleaning process is performed.

In certain embodiments, the first on-off valve may be closed and a second on-off valve installed on the exhaust line may be opened when the cleaning process is performed. The first on-off valve may be opened and the second on-off valve may be closed when the exposure process is performed.

In certain embodiments, the substrate may be a dummy wafer.

In certain embodiments, the particles may be analyzed by photographing the substrate when the cleaning process is performed.

In certain embodiments, the particles may be analyzed to change at least one of a kind of the cleaning gas, a flow rate of the cleaning gas or a cleaning performance time.

In certain embodiments, the chamber may be controlled in a vacuum, and the light may be extreme ultraviolet.

In certain embodiments a method includes: generating light from a light source system; controlling and patterning the generated light by a plurality of reflection members of a chamber of an optical system; transmitting the patterned light to a substrate system to perform an exposure process on a substrate while a first on-off valve disposed between the chamber and the substrate system is open; closing the first on-off valve to seal the chamber after the exposure process; and supplying a cleaning gas into the chamber to clean the inside of the chamber while the first on-off valve is closed.

In certain embodiments, a method includes: coating a photosensitive layer on a substrate; loading the substrate on a support member of a substrate system of an exposure apparatus; performing an exposure process by exposing the photosensitive layer to a patterned light by the exposure apparatus, and cleaning a second chamber of the exposure apparatus during the exposure process; and developing the photosensitive layer to form a photosensitive pattern. The exposure apparatus may include: a light source system generating light, an optical system to control and pattern the light, the optical system including an illuminating optical system, a mask system, and a projecting optical system, the projecting optical system having the second chamber. The substrate system may include the substrate on which the exposing is performed by the patterned light.

BRIEF DESCRIPTION OF THE DRAWINGS

Various aspects of the inventive concepts will become more apparent in view of the attached drawings and accompanying detailed description.

FIG. 9 is a flowchart illustrating a manufacturing method of a semiconductor device using an exposure apparatus according to example embodiments of the inventive concepts.

DETAILED DESCRIPTION OF THE EMBODIMENTS

Figure 1:
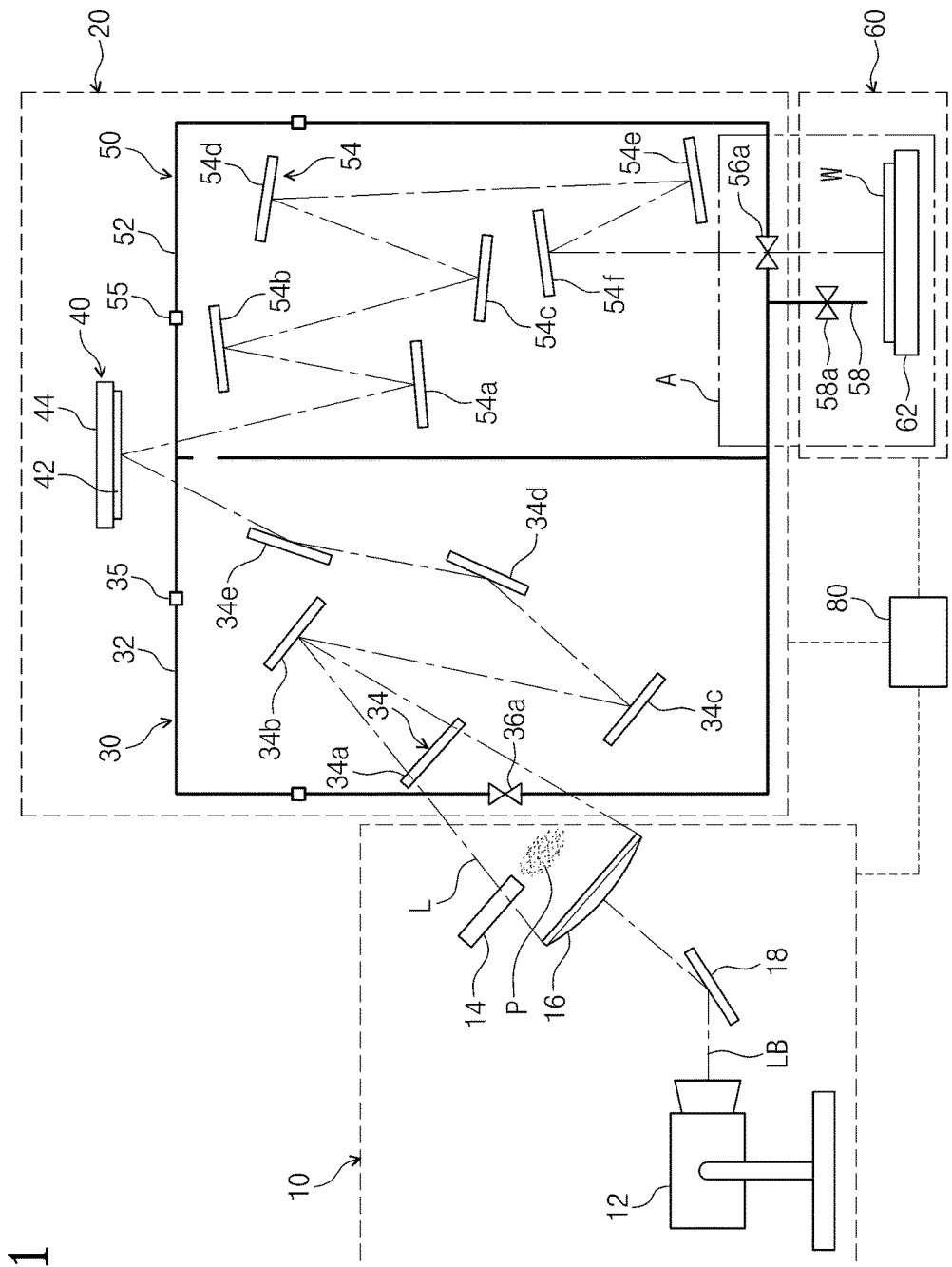
FIG. 1 is a schematic view illustrating an exposure apparatus according to example embodiments of the inventive concepts.

The present disclosure will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity. The same reference numerals or the same reference designators denote the same elements throughout the specification.

Unless defined otherwise, all technical and scientific terms used herein have the same meaning as commonly understood by one of ordinary skill in the art.

As used herein, the singular terms "a," "an" and "the" are intended to include the plural forms as well, unless the context clearly indicates otherwise. As used herein, the term "and/or" includes any and all combinations of one or more of the associated listed items. It will be further understood that the terms "comprises", "comprising," "having," "containing," "includes" and/or "including", when used herein, are to be construed as open-ended terms and specify the presence of stated features, integers, steps, operations, elements, and/or components, but do not preclude the presence or addition of one or more other features, integers, steps, operations, elements, components, and/or groups thereof.

Spatially relative terms, such as "top," "bottom," "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be understood that, although the terms "first", "second", etc., may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below could be termed a second element, component, region, layer or section without departing from the teachings of example embodiments.

Additionally, the exemplary embodiments in the detailed description will be described with cross-sectional, perspective and plan views as ideal exemplary views of the inventive concepts. In the drawings, the thicknesses of layers and regions are exaggerated for clarity. Accordingly, shapes of the exemplary views may be modified according to manufacturing techniques and/or allowable errors.

Figure 2:
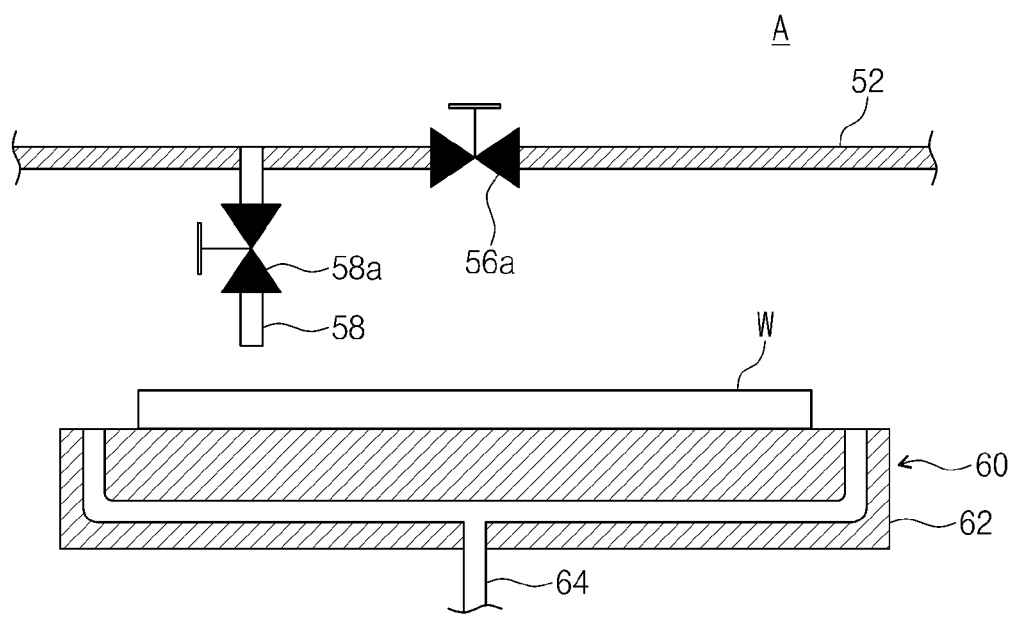
FIG. 2 is an enlarged view of a portion 'A' of the exposure apparatus of FIG. 1, according to example embodiments.

FIG. 1 is a schematic view illustrating an exposure apparatus 1 according to example embodiments of the inventive concepts, and FIG. 2 is an enlarged view of a portion 'A' of the exposure apparatus of FIG. 1. Referring to FIGS. 1 and 2, the exposure apparatus 1 may include a light source system 10, an optical system 20, a substrate system 60, and a control unit 80.

The light source system 10 may generate light. In some embodiments, the light source system 10 may generate exposure light that is used to perform an exposure process on a substrate W. The exposure light may be, for example, extreme ultraviolet (EUV), also referred to as extreme ultraviolet light. The extreme ultraviolet may have a wavelength of 10 nm to 50 nm. For example, in one embodiment, the extreme ultraviolet may have the wavelength of 13.5 nm.

The light source system 10 may include a light source 12, a target 14, a condenser mirror 16, and a light-condensing unit 18. The light source 12 may supply, for example, a laser beam LB having a high-density pulse. The light source 12 may include laser plasma and spark plasma. For example, the light source 12 may include $CO_2$ Laser, Nd:YAG laser, free electron laser (FEL), ArF eximer laser, fluoride dimer ($F_2$) laser, or KrF eximer laser. The laser beam LB may be irradiated to the target 14 to generate plasma P. As a result, extreme ultraviolet L may be emitted from the plasma P. The condenser mirror 16 may condense the extreme ultraviolet L. The light-condensing unit 18 may supply the laser beam LB to the condenser mirror 16. The extreme ultraviolet L condensed from the condenser mirror 16 may be incident on the optical system 20. In some embodiments, the light source system 10 may further include a filter (not shown) located in front of the condenser mirror 16. Thus, if light having a different wavelength from the extreme ultraviolet L is generated from the plasma P, the extreme ultraviolet L may be selectively transmitted through the filter (not shown). For example, the filter (not shown) may be a zirconium filter.

In some embodiments, the optical system 20 may include an illuminating optical system 30, a mask system 40, and a projecting optical system 50. The illuminating optical system 30 may transmit the light (e.g., the extreme ultraviolet L) received from the light source system 10 to the mask system 40. The mask system 40 may pattern the light transmitted from the illuminating optical system 30. The projecting optical system 50 may transmit the light patterned by the mask system 40 to the substrate system 60.

In some embodiments, the illuminating optical system 30 may include a first chamber 32, a first reflection member 34, and a first gas supply member 35. The first chamber 32 may be, for example, a vacuum chamber. The first chamber 32 may include a source on-off valve installed at one sidewall of the first chamber 32. The source on-off valve may control supply of the light (e.g., the extreme ultraviolet L). The first reflection member 34 may be provided within the first chamber 32. The first reflection member 34 may include a mirror. For example, the first reflection member 34 may include a multi-layer mirror. The first reflection member 34 may include a plurality of sub first reflection members 34a, 34b, 34c, 34d and 34e. In FIG. 1, the number of the sub first reflection members 34a, 34b, 34c, 34d and 34e is five. However, embodiments of the inventive concepts are not limited to the number and positions of the sub first reflection members. The sub first reflection members 34a, 34b, 34c, 34d and 34e may transmit the extreme ultraviolet L received from the light source system 10 to the mask system 40. The extreme ultraviolet L may be adjusted to have optimum uniformity and intensity distribution by the sub first reflection members 34a, 34b, 34c, 34d and 34e. The first gas supply member 35 may inject or supply a gas into the first chamber 32. The first gas supply member 35 may be provided in plurality. In some embodiments, the first gas supply member 35 may supply a cleaning gas for cleaning the inside of the first chamber 32. For example, the cleaning gas may include at least one of extreme clean dry air (XCDA), argon (Ar), hydrogen ($H_2$), or nitrogen ($N_2$). In some embodiments, the illuminating optical system 30 may further include a vacuum pump (not shown) for creating a vacuum in the inside of the first chamber 32. In addition, the illuminating optical system 30 may further include various lenses and/or various optical elements.

The mask system 40 may include a reticle 42 having a circuit pattern and a reticle stage 44 supporting the reticle 42. The mask system 40 may pattern the light provided from the illuminating optical system 30. For example, the mask system 40 may selectively project and/or reflect the light provided from the illuminating optical system 30 to pattern the light. The mask system 40 may provide the patterned light to the projecting optical system 50.

In some embodiments, the projecting optical system 50 may include a second chamber 52, a second reflection member 54, a second gas supply member 55, a first on-off valve 56a, and an exhaust line 58. The pattern of the reticle 42 may be projected and shrunk by the projecting optical system 50. The second chamber 52 may be, for example, a vacuum chamber. Referring to FIG. 1, the first chamber 32 may be connected to the second chamber 52. For example, the inside (e.g., an inner space) of the first chamber 32 may be connected to the side (e.g., an inner space) of the second chamber 52 through a connection path. Hereinafter, the first and second chambers 32 and 52 connected to each other will be described as an example. Optionally, the first and second chambers 32 and 52 may be provided independently of each other. The second reflection member 54 may be provided within the second chamber 52. The second reflection member 54 may include a mirror. For example, the second reflection member 54 may include a multi-layer mirror. The second reflection member 54 may include a plurality of sub second reflection members 54a, 54b, 54c, 54d, 54e and 54f. In FIG. 1, the number of the sub second reflection members 54a, 54b, 54c, 54d, 54e and 54f is six. However, embodiments of the inventive concepts are not limited to the number and positions of the sub second reflection members. The sub second reflection members 54a, 54b, 54c, 54d, 54e and 54f may project and transmit the patterned light received from the mask system 40 to the substrate system 60. The second gas supply member 55 may inject or supply a gas into the second chamber 52. In some embodiments, the second gas supply member 55 may supply a cleaning gas for cleaning the inside of the second chamber 52. For example, the cleaning gas may include at least one of extreme clean dry air (XCDA), argon (Ar), hydrogen ($H_2$), or nitrogen ($N_2$). The second gas supply member 55 may be provided in plurality. In some embodiments, the projecting optical system 50 may further include a vacuum pump (not shown) for creating a vacuum in the inside of the second chamber 52. In addition, the projecting optical system 50 may further include various lenses and/or various optical elements. The various gas supply members described herein may include, for example, tubes having openings or nozzles thereon and through which gas may be supplied.

The first on-off valve 56a may be installed on one side of the second chamber 52 which is opposite to the substrate system 60. For example, the first on-off valve 56 may be provided at a position vertically overlapping with the substrate system 60. The optical system 20 may be sealed or opened by the first on-off valve 56a.

The exhaust line 58 may extend from one side of the second chamber 52 opposite to the substrate system 60. In some embodiments, as illustrated in FIG. 2, the exhaust line 58 may be disposed adjacently to the first on-off valve 56a. A second on-off valve 58a opening and closing the exhaust line 58 may be installed on the exhaust line 58. The exhaust line 58 may extend from the second chamber 52 into the substrate system 60 and toward the substrate W loaded on the substrate system 60. An end of the exhaust line 58 may be disposed over the substrate W in the substrate system 60.

In some embodiments, the substrate system 60 may include a support member 62. The substrate W may be loaded on the support member 62. The support member 62 may further include a clamp (not shown) to fix the substrate W. In some embodiments, the support member 62 may support and hold the substrate W by vacuum suction or electrostatic force. The substrate W may be exposed by the light provided from the optical system 20 to project or transfer the pattern of reticle 42 to the substrate W. The support member 62 may include a suction line 64 disposed therein. The suction line 64 may suck particles falling to the substrate W by vacuum suction.

In some embodiments, the control unit 80 may control the light source system 10, the optical system 20, and the substrate system 60. The control unit 80 may control the exposure apparatus 1 such that the exposure process may be performed on the substrate W or the cleaning process may be performed to the inside of the second chamber 52. The control unit 80 may selectively open and/or close the first on-off valve 56a and the second on-off valve 58a. The control unit 80 may control opening and closing of the second chamber 52 to selectively perform the exposure process of the substrate W and the cleaning process of the inside of the second chamber 52.

Figure 3:
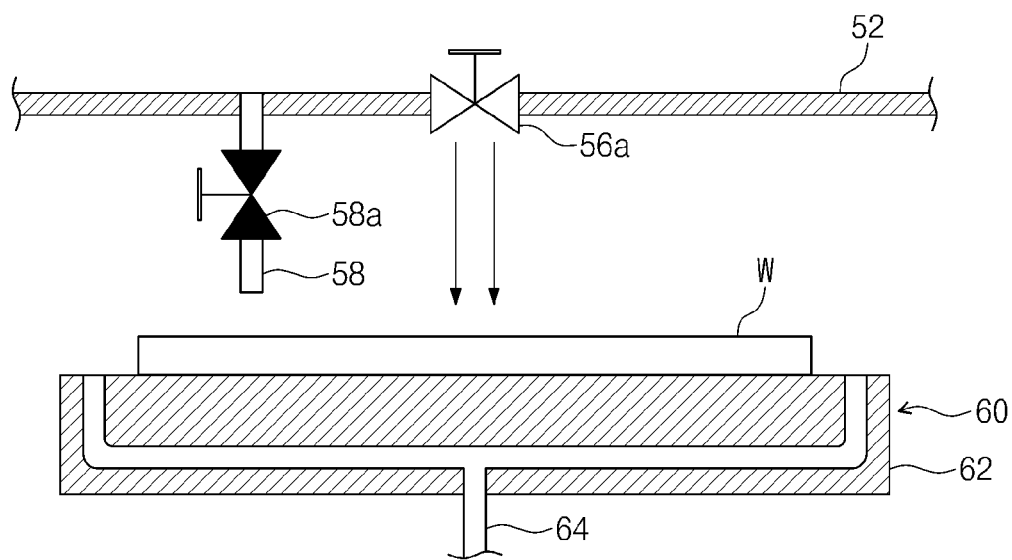
FIGS. 3 to 5 are views illustrating an exposure process and a cleaning process performed by a control unit according to example embodiments of the inventive concepts.
Figure 4:
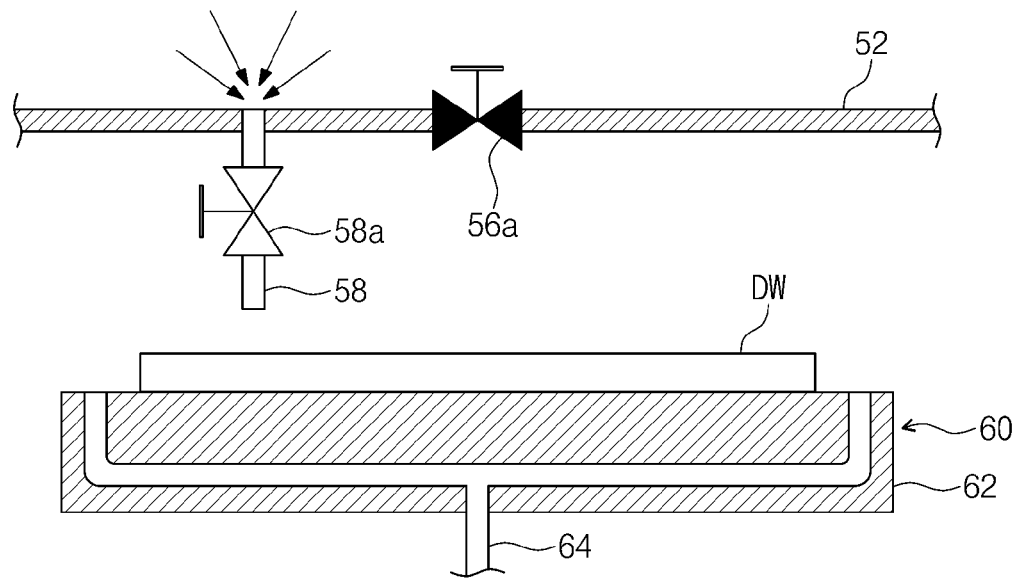
Figure 5:
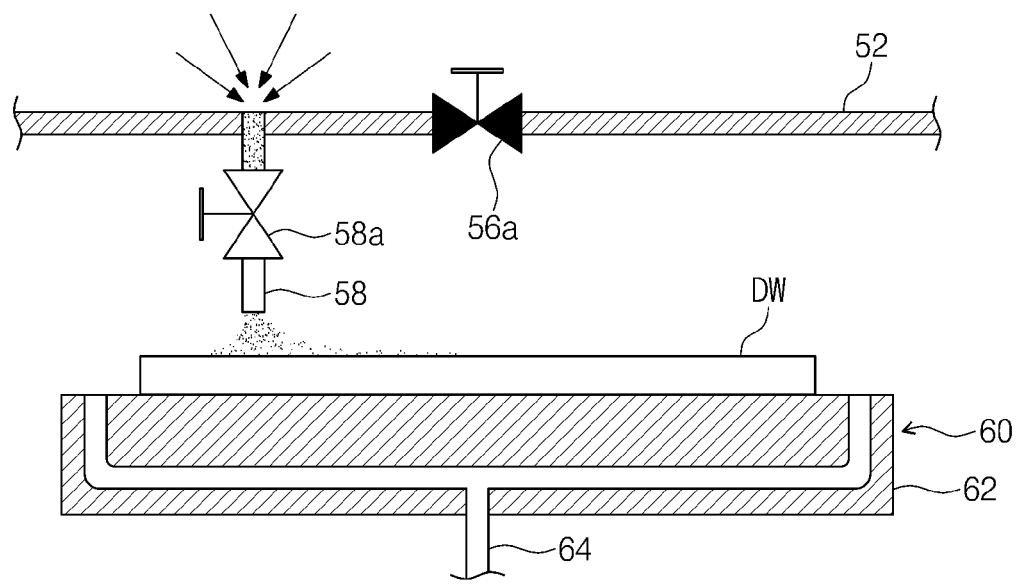
Figure 6:
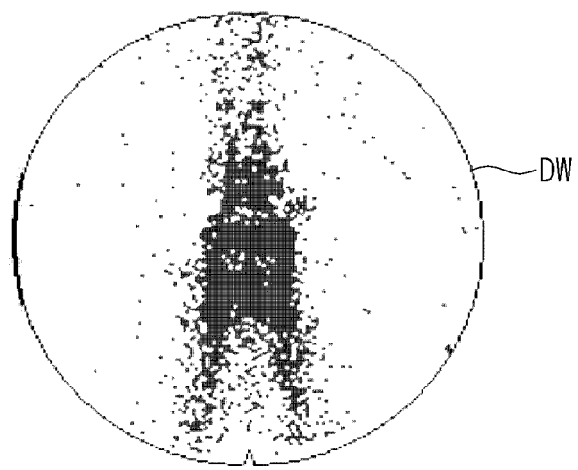
FIG. 6 is a plan view illustrating a substrate after the cleaning process, according to example embodiments.

FIGS. 3 to 5 are views illustrating an exposure process and a cleaning process performed by the control unit 80. FIG. 6 is a plan view illustrating a substrate DW after the cleaning process. Hereinafter, the exposure process and the cleaning process will be described in more detail with reference to FIGS. 3 to 6. Referring to FIGS. 1 and 3, when the exposure process is performed, the control unit 80 may control the optical system 20 such that the first on-off valve 56a is opened and the second on-off valve 58a is closed. Thus, the exposure light may be incident on the substrate W to perform the exposure process. Referring to FIG. 4, the control unit 80 may perform the cleaning process to the inside of the second chamber 52 during or after the exposure process. If desired, the control unit 80 may close the first on-off valve 56a during the exposure process. Thus, the control unit 80 may perform the cleaning process even during the exposure process. The control unit 80 may close the first on-off valve 56a and may supply the cleaning gas into the inside of the second chamber 52. The cleaning gas may be supplied into the second chamber 52 through at least one of the first and second gas supply members 35 and 55. The cleaning gas supplied through the first gas supply member 35 may be supplied from the inside of the first chamber 32 into the inside of the second chamber 52 through the connection path. The cleaning gas supplied through the second gas supply member 55 may be supplied directly into the inside of the second chamber 52. The control unit 80 may generate a gas current using the cleaning gas to clean the inside of the second chamber 52. For example, the cleaning gas may include at least one of extreme clean dry air (XCDA), argon (Ar), hydrogen ($H_2$), or nitrogen ($N_2$). At this time, as illustrated in FIGS. 5 and 6, the control unit 80 may open the second on-off valve 58a to exhaust particles from the inside of the second chamber 52 to the outside of the second chamber 52. The particles may be exhausted to a top surface of the substrate W through the exhaust line 58. Thus, recontamination of the substrate W and the reticle 42 may be minimized or prevented and process efficiency may be improved. In one embodiment, the substrate W for this operation may be a dummy wafer DW. In other embodiments, a wafer being manufactured that is not a dummy wafer can be placed in the chamber for exposure.

The control unit 80 may selectively control opening and closing of the second chamber 52 to adjust a cleaning start time and a cleaning performance time of the inside of the second chamber 52. The cleaning process may start at the cleaning start time and may be performed during the cleaning performance time. Thus, the control unit 80 may control a down-time of the exposure apparatus 1 and may perform the cleaning process of the inside of the second chamber 52 as needed. In some embodiments, the cleaning process may be performed to the inside of the second chamber 52 during a waiting time in operation of the exposure apparatus 1. For example, the cleaning process may be performed after a start time of an exposure operation, but before the exposure operation is complete. Thus, cleanliness of the exposure apparatus 1 may be improved, and recontamination of the reticle 42 and the substrate W may be minimized or prevented.

Figure 7:
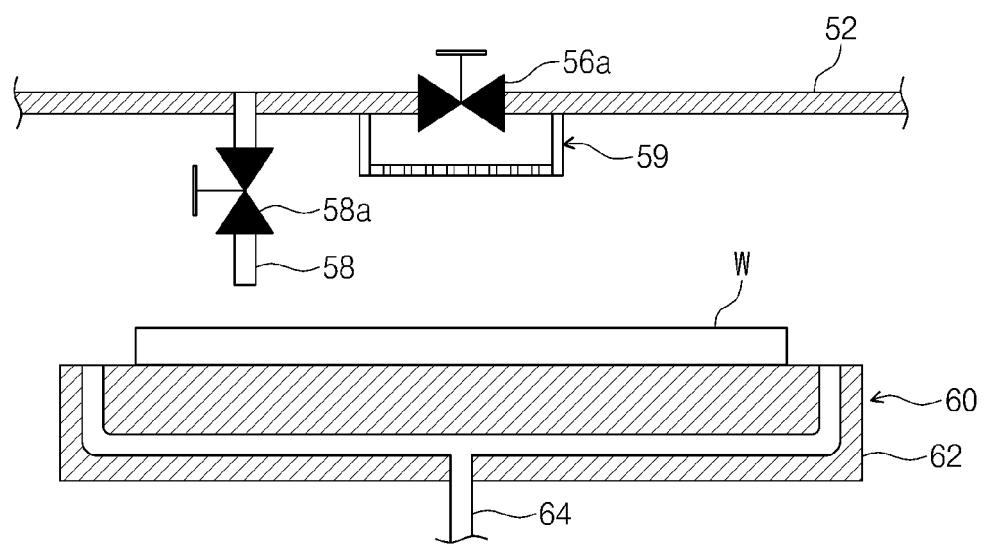
FIG. 7 is a view illustrating an optical system further including an adsorption member according to example embodiments of the inventive concepts.

FIG. 7 is a view illustrating an optical system 20 further including an adsorption member 59. In an embodiment, the optical system 20 may further include an adsorption member 59. The adsorption member 59 may be disposed on one side of the second chamber 52 opposite to the substrate system 60. In some embodiments, the adsorption member 59 may be disposed on an outer surface of a first side of the second chamber 52 so as to overlap with the first on-off valve 56a. As such, the adsorption member 59 may cover the first on-off valve 56a. When particles are exhausted from the second chamber 52 during the exposure process, the adsorption member 59 may adsorb the particles. The adsorption member 59 may include a filter. The adsorption member 59 may include a mesh shape. The adsorption member 59 may be detachable. Optionally, the adsorption member 59 may be provided in the second chamber 52. The adsorption member 59 may inhibit particles from reaching the substrate and/or from remaining inside of the second process chamber 52, thereby improving process efficiency by increasing a period of the cleaning process of the inside of the second chamber 52.

Figure 8:
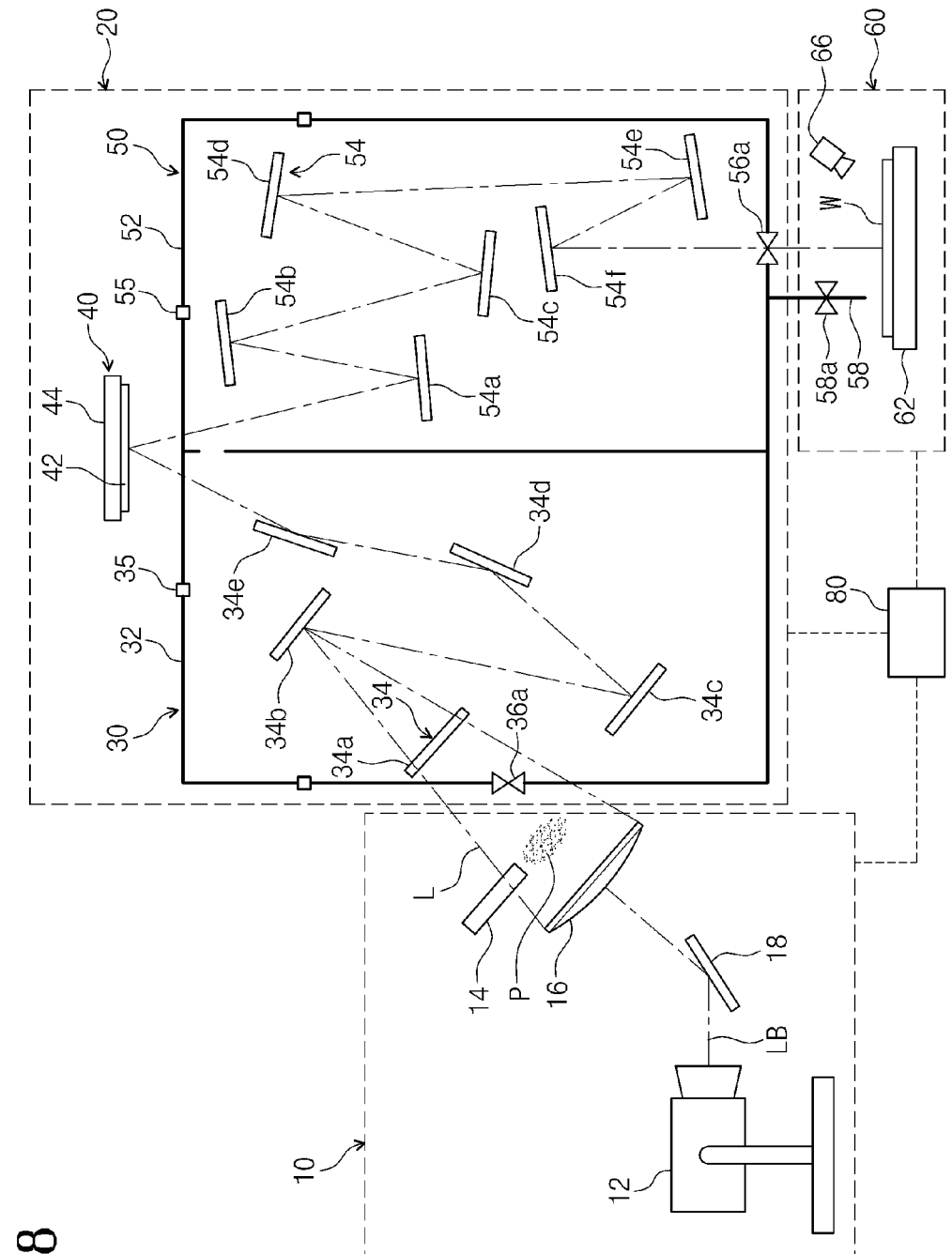
FIG. 8 is a schematic view illustrating an exposure apparatus according to example embodiments of the inventive concepts.

FIG. 8 is a schematic view illustrating an exposure apparatus 2 according to example embodiments of the inventive concepts. Referring to FIG. 8, an exposure apparatus 2 may include a light source system 10, an optical system 20, a substrate system 60, and a control unit 80. The light source system 10 and the optical system 20 of the exposure apparatus 2 of FIG. 8 may be the same or similar shapes and functions as the light source system 10 and the optical system 20 of the exposure apparatus 1 of FIG. 1, respectively, and thus, the detailed descriptions thereto will be omitted for the purpose of ease and convenience in explanation.

Referring to FIG. 8, the substrate system 60 may include a support member 62 and an image-sensing member 66. A substrate W may be loaded on a top surface of the support member 62. The support member 62 may further include a clamp (not shown) fixing the substrate W. Optionally, the support member 62 may support and hold the substrate W by vacuum suction or electrostatic force. The substrate W may be exposed by the light provided from the optical system 20 to project or transfer the pattern of reticle 42 to the substrate W. The support member 62 may include a suction line (not shown) disposed therein. The suction line (not shown) may suck particles falling to the substrate W by a vacuum suction.

The image-sensing member 66 may photograph particles exhausted from the exhaust line 58. In some embodiments, as illustrated in FIG. 8, the image-sensing member 66 may photograph the particles exhausted to a top surface of the substrate W and may transmit image data of the particles to the control unit 80. The image-sensing member 66 may be, for example, a camera. In one embodiment, the substrate W for this operation may be a dummy wafer. In other embodiments, the substrate W for this operation may be a wafer being processed into a semiconductor device.

The control unit 80 may control the light source system 10, the optical system 20, and the substrate system 60. The control unit 80 may control the exposure apparatus 2 such that the exposure process may be performed on the substrate W or the cleaning process may be performed to the inside of the second chamber 52. The control unit 80 may selectively open and/or close the first on-off valve 56a and the second on-off valve 58a. The control unit 80 may control opening and closing of the second chamber 52 to selectively perform the exposure process of the substrate W and the cleaning process of the inside of the second chamber 52. When the exposure process is performed, the control unit 80 may control the optical system 20 such that the first on-off valve 56a is opened and the second on-off valve 58a is closed. Thus, the exposure light may be incident on the substrate W to perform the exposure process. The control unit 80 may perform the cleaning process to the inside of the second chamber 52 during or after the exposure process. If desired, the control unit 80 may close the first on-off valve 56a during the exposure process. This may occur, for example, during a wait time for the exposure process. For example, during the exposure process for a particular layer of photosensitive material, a cleaning process may occur during a wait time of the exposure process before it is complete. Thus, the control unit 80 may perform the cleaning process even during the exposure process. The control unit 80 may close the first on-off valve 56a and may supply the cleaning gas into the second chamber 52. The control unit 80 may generate a gas current using the cleaning gas to clean the inside of the second chamber 52. For example, the cleaning gas may include at least one of extreme clean dry air (XCDA), argon (Ar), hydrogen ($H_2$), or nitrogen ($N_2$). At this time, the control unit 80 may open the second on-off valve 58a to exhaust particles from the inside of the second chamber 52 to the outside of the second chamber 52. The particles may be exhausted to the top surface of the substrate W through the exhaust line 58.

The control unit 80 may control the image-sensing member 66 such that the image sensing member 66 photographs the particles exhausted onto the substrate W. The control unit may receive the image data of the particles from the image-sensing member 66 and may analyze the received image data. The control unit 80 may include a graphical user interface (GUI) unit. In some embodiments, the control unit 80 may change at least one of a kind of the cleaning gas, a flow rate of the cleaning gas or the cleaning performance time, based on analysis results of the image data. Thus, detection and analysis of the particles in the second chamber 52 may be performed in-situ. For example, the detection and analysis may occur during the cleaning as part of a continual supply of gas to the chamber. Thus, in certain embodiments, the photographs and analysis may occur during the cleaning process, without requiring a vacuum break for removing the gas prior to taking the photographs and performing the analysis.

The control unit 80 may selectively control opening and closing of the second chamber 52 to adjust the cleaning start time and the cleaning performance time of the inside of the second chamber 52. Thus, the control unit 80 may control a down-time of the exposure apparatus 2 and may perform the cleaning process of the inside of the second chamber 52 as needed. In some embodiments, the cleaning process may be performed to the inside of the second chamber 52 during a waiting time in operation of the exposure apparatus 2. In addition, a particle state of the inside of the second chamber 52 may be analyzed in-situ in real time to adjust at least one of the kind of the cleaning gas, the flow rate of the cleaning gas or the cleaning performance time, thereby improving cleaning efficiency. As a result, the cleanliness of the exposure apparatus 2 may be improved, and recontamination of the reticle 42 and the substrate W may be minimized or prevented.

In the exposure apparatus according to the above-mentioned embodiments of the inventive concepts, the second chamber 52 of the projecting optical system 50 is connected to the first chamber 32 of the illuminating optical system 30. Alternatively, the second chamber 52 may be independent of the first chamber 32. In some embodiments, the first chamber 32 and the second chamber 52 may be divided from each other by a partition in a single chamber. The cleaning method of the inside of the chamber according to the inventive concepts may be applied to various process apparatuses using vacuum chambers as well as the exposure apparatus.

According to example embodiments of the inventive concepts, the vacuum chamber may be selectively opened or closed to adjust the cleaning start time and the cleaning performance time of the inside of the chamber. Thus, the particles in the chamber may be reduced to minimize or prevent recontamination of the reticle and the substrate. In addition, the particle state may be analyzed in-situ in real time to adjust the kind of the cleaning gas, the flow rate of the cleaning gas and/or the cleaning performance time, so the cleaning efficiency may be improved.

In certain embodiments, as depicted for example in FIG. 9, the exposure apparatus 1, 2 of one of the examples described above may be applied to a manufacturing process for a semiconductor device or a display device. In a semiconductor manufacturing process, a substrate W may have a photosensitive layer (not shown) on top of the substrate W (step 801). For example, the substrate W may be a semiconductor substrate such as a silicon wafer coated with a photosensitive layer. The substrate W may have formed thereon a layer of metal, insulator, or semiconductor material formed between the substrate W and the photosensitive layer (not shown). A pattern of metal, insulator, or semiconductor material may be formed between the substrate W and the photosensitive layer (not shown).

The substrate W may be provided on the support member 62 (FIG. 1) of the substrate system 60 (FIG. 1). (step 802) The photosensitive layer (not shown) may be exposed to a patterned light by the exposure apparatus 1, 2 (step 803). The control unit 80 (FIG. 1) may control opening and closing of the second chamber 52 to selectively perform the exposure process on the substrate W and the cleaning process of the inside of the second chamber 52. When the exposure process is performed, the control unit 80 may control the optical system 20 such that the first on-off valve 56a is opened and the second on-off valve 58a is closed.

Thus, the exposure light may be incident on the substrate W to perform the exposure process. After the exposure process, the control unit 80 may close the first on-off valve 56a such that the second chamber 52 is sealed (step 804).

The control unit 80 may supply the cleaning gas into the inside of the second chamber 52 (step 805). The cleaning gas may be supplied into the second chamber 52 through at least one of the first and second gas supply members 35 and 55. The cleaning gas supplied through the first gas supply member 35 may be supplied from the inside of the first chamber 32 into the inside of the second chamber 52 through the connection path. The cleaning gas supplied through the second gas supply member 55 may be supplied directly into the inside of the second chamber 52. The control unit 80 may generate a gas current using the cleaning gas to clean the inside of the second chamber 52. For example, the cleaning gas may include at least one of extreme clean dry air (XCDA), argon (Ar), hydrogen ($H_2$), or nitrogen ($N_2$). During of after the cleaning process, the control unit 80 may open the second on-off valve 58a to exhaust particles from the inside of the second chamber 52 to the outside of the second chamber 52. The photosensitive layer may be developed to form a photosensitive layer pattern after it is exposed to the patterned light (step 806).

In some other embodiments, the control unit 80 may perform the cleaning process to the inside of the second chamber 52 during the exposure process. During the exposure process, the control unit 80 may close the first on-off valve 56a and may supply the cleaning gas into the inside of the second chamber 52. The control unit 80 may generate a gas current using the cleaning gas to clean the inside of the second chamber 52.

In some other embodiments, the exposure apparatus 1, 2 of one of the examples described above may be applied to a manufacturing process for a semiconductor device. In a manufacturing method for the semiconductor device, a substrate W including doped regions for forming transistors and optionally including one or more layers or patterns formed thereon may have a photosensitive layer (not shown) on top of the substrate W. The substrate W may be provided on the support member 62 of the substrate system 60. The photosensitive layer (not shown) may be exposed to a patterned light by the exposure apparatus 1, 2. When the exposure process is performed, the control unit 80 may control the optical system 20 such that the first on-off valve 56a is opened and the second on-off valve 58a is closed. Thus, the exposure light may be incident on the substrate W to perform the exposure process. During or after the exposure process, the control unit 80 may close the first on-off valve 56a. The control unit 80 may supply the cleaning gas into the inside of the second chamber 52 and the control unit 80 may generate a gas current using the cleaning gas to clean the inside of the second chamber 52. The photosensitive layer may be developed to form a photosensitive layer pattern after it is exposed to the patterned light. One of more layers of the substrate may then be patterned using the patterned photosensitive layer, in order to form, for example, a semiconductor device (e.g., an integrated circuit formed on a chip).

While various aspects of the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method for cleaning an exposure apparatus, the method comprising:
generating light from a light source system;
controlling and patterning the generated light by a reflection member of a chamber of an optical system;
transmitting the patterned light to a substrate system to perform an exposure process on a substrate;
closing a first on-off valve disposed between the chamber and the substrate system to seal the chamber during or after the exposure process; and
during or after the exposure process, supplying a cleaning gas into the chamber to perform a cleaning process to the inside of the chamber,
wherein particles in the chamber are exhausted to the substrate through an exhaust line extending from the chamber while the cleaning process is performed.

2. The method of claim 1, wherein supplying the cleaning gas into the chamber is performed while the cleaning process is performed.

3. The method of claim 1, wherein the optical system comprises an adsorption member disposed on the chamber adjacent to the first on-off valve to adsorb particles occurring during the exposure process,
wherein the adsorption member is disposed between the first on-off valve and the substrate system, and
wherein the adsorption member adsorbs particles coming through the first on-off valve when the first on-off valve is open.

4. The method of claim 1, wherein the cleaning gas comprises at least one of extreme clean dry air, argon, hydrogen and nitrogen.

* * * * *